United States Patent
Nakamura et al.

(10) Patent No.: US 7,547,587 B2
(45) Date of Patent: Jun. 16, 2009

(54) METHOD FOR MANUFACTURING SEMICONDUCTOR LIGHT EMITTING DEVICE

(75) Inventors: Hitoshi Nakamura, Tokyo (JP); Hajime Abe, Tokyo (JP); Noriaki Ishio, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/052,777

(22) Filed: Mar. 21, 2008

(65) Prior Publication Data

US 2009/0111203 A1    Apr. 30, 2009

(30) Foreign Application Priority Data

Oct. 31, 2007    (JP)    ............................. 2007-283990

(51) Int. Cl.
*H01L 21/20*    (2006.01)

(52) U.S. Cl. .......................... 438/141; 438/30; 438/91; 257/E21.32; 257/E21.126; 257/E21.352; 257/E21.365

(58) Field of Classification Search ............... 438/30, 438/91, 141, 311, 602, 606, 624
See application file for complete search history.

(56) References Cited

U.S. PATENT DOCUMENTS

| 6,774,968 | B2 * | 8/2004 | Hagiwara | .................... 349/139 |
| 7,088,416 | B2 * | 8/2006 | Hagiwara | .................... 349/149 |
| 2002/0080319 | A1 * | 6/2002 | Hagiwara | .................... 349/153 |
| 2004/0239858 | A1 * | 12/2004 | Hagiwara | .................... 349/139 |

FOREIGN PATENT DOCUMENTS

| JP | 7-86687 | 3/1995 |
| JP | 10-144989 | 5/1998 |

* cited by examiner

*Primary Examiner*—David Nhu
(74) *Attorney, Agent, or Firm*—Leydig, Voit & Mayer, Ltd.

(57) ABSTRACT

A laminated structure having light-emitting units is formed on a single-crystal wafer. Electrode patterns are formed on the single-crystal wafer opposite the light-emitting units. Dummy patterns are formed on the single-crystal wafer at a location spaced apart from a location opposite the light-emitting units, and offset from a desired cleavage line intersecting the light-emitting units. A scratch is formed on the desired cleavage line. The wafer is cleaved, originating on the scratch, along the cleavage line orientation, in the direction from the dummy pattern, toward the light-emitting units.

4 Claims, 11 Drawing Sheets cleavage region

METHOD FOR MANUFACTURING SEMICONDUCTOR LIGHT EMITTING DEVICE

BACKGROUND OF THE INVENTION

1. Field of the Invention

The present invention relates to a semiconductor light-emitting device that can prevent difference in level from overlapping the light-emitting unit in an end surface.

2. Background Art

In a semiconductor light-emitting device that emits light from an end surface, an optical thin film is grown on the end surface by sputtering or vacuum deposition for controlling reflectance, preventing end surface deterioration, and elevating outputs. However, if the end surface that becomes the base has irregularity, the optical thin film also has irregularity to vary the refractive index. Therefore, to make the end surface be a flat mirror surface, a technique using the cleavage of a single-crystal wafer as shown below is generally used.

First, as shown in FIG. 21, electrode patterns 17 of semiconductor light-emitting devices are formed on a single-crystal wafer 12. Here, it is ideal to form the electrode pattern 17 of each semiconductor light-emitting device so as to be parallel to the cleavage orientation of the single-crystal wafer 12. FIG. 22 is an enlarged plan view of the electrode patterns shown in FIG. 21. The width of the electrode pattern 17 is narrowed in the cleavage region than in other regions, so that the cleavage of the single-crystal wafer 12 is not damaged, and the semiconductor light-emitting devices are used for image recognition in scribing or breaking described later.

Next, as shown in FIG. 23, scratches 24 are formed using a diamond needle 23 on desired cleavage lines 22 on one side of the single-crystal wafer 12 (scribing). Next, as shown in FIG. 24, a load is applied from the back side of the scratches 24 (breaking). Thereby, the single-crystal wafer 12 is cleaved originating on the scratches 24 along the cleavage orientation. Cleavage herein is performed from the right to the left in the drawings. By the cleavage, the end surfaces of the semiconductor light-emitting devices ideally have flat mirror surfaces.

In actual situations, however, since various thin films are grown on a single-crystal wafer 12, the normal development of cleavages is interfered. As a result, the cleavage 19 is deviated from a desired cleavage line 22 as shown in the plan view of FIG. 25, and difference in level 20 occurs on the end surface as shown in the sectional view of FIG. 26. If the difference in level 20 overlaps a light-emitting unit 11, light-emitting properties and reliability are affected, and a defective device is produced.

In order to solve such a problem, a semiconductor light-emitting device as shown in FIG. 27 has been proposed (refer to e.g., Japanese Patent Application Laid-Open No. 7-086687). GaAs layers 34 and 35 are formed as clad layers on the upper and bottom surfaces of an active layer 33 required for light emission. Under the lower GaAs layer 35, a poorly cleavable AlGaAs layer 36 is formed. An element isolation groove 37 is deeper than the AlGaAs layer 36. By such a structure, even if the normal development of cleavage is interfered and difference in level occurs, since difference in level on the end surface are concentrated in the element isolation groove 37, the difference in level 20 is prevented from overlapping the light-emitting unit 11.

SUMMARY OF THE INVENTION

In the semiconductor light-emitting device shown in FIG. 27, electrode patterns are actually formed on the upper and bottom surfaces for conduction. As described above, although the electrode patterns are ideally formed so as to be arranged in parallel to the cleavage orientation of the single-crystal wafer, they may be not parallel due to the accuracy of the exposing device and the like. In this case, as shown in FIG. 28, the cleavage 19 develops along the cleavage orientation of the single-crystal wafer 12 (direction tilted from the electrode patterns 17), and contacts the electrode pattern 17 at a certain point. Thereafter, the cleavage 19 is corrected along the electrode pattern 17. Therefore, difference in level 20 due to the offset of the cleaved surface is produced on the end surface, as shown in FIG. 29.

The cleavage 19 is developed along the electrode pattern 17 even after contacting the electrode pattern 17. However, since the developing direction is out of alignment to the cleavage orientation, there is possibility of the occurrence of difference in level 38 even less apparent compared with difference in level 20. If these differences in level 20 and 38 overlap the light-emitting unit 11, light-emitting properties and reliability are affected, and a defective device is produced.

To solve the above-described problems, it is an object of the present invention to provide a semiconductor light-emitting device that can prevent difference in level from overlapping the light-emitting unit in an end surface.

According to one aspect of the present invention, a method for manufacturing a semiconductor light-emitting device comprising the steps of: forming a laminated structure having light-emitting units on a wafer; forming electrode patterns on said wafer above said light-emitting units; forming first dummy patterns on said wafer at location apart from above said light-emitting units, and where cleavage offset from a desired cleavage line intersecting said light-emitting units contacts; forming a scratch on said desired cleavage line; and cleaving said wafer originating on said scratch along cleavage orientation in the direction from said first dummy pattern toward said light-emitting units.

According to the present invention, overlapping of difference in level on the light-emitting unit in an end surface can be prevented.

Other and further objects, features and advantages of the invention will appear more fully from the following description.

DETAILED DESCRIPTION OF THE PREFERRED EMBODIMENTS

First Embodiment

Figure 1:
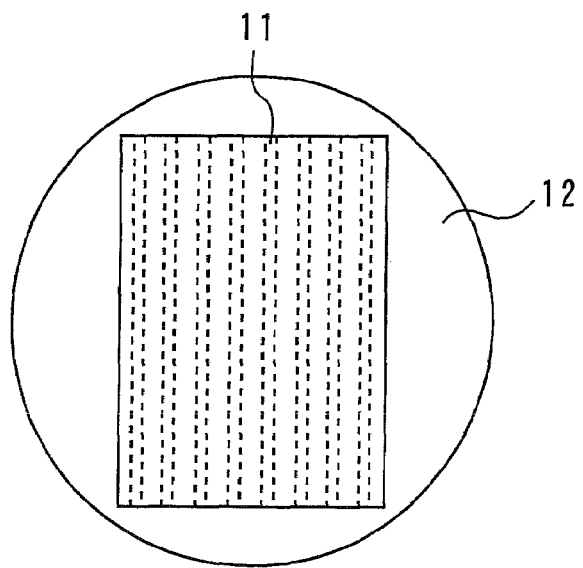
FIGS. 1-9 are views for explaining a method of manufacturing a semiconductor light-emitting device according to First Embodiment of the present invention.

A method for manufacturing a semiconductor light-emitting device according to the first embodiment of the present invention will be described referring to the drawings.

Figure 2:
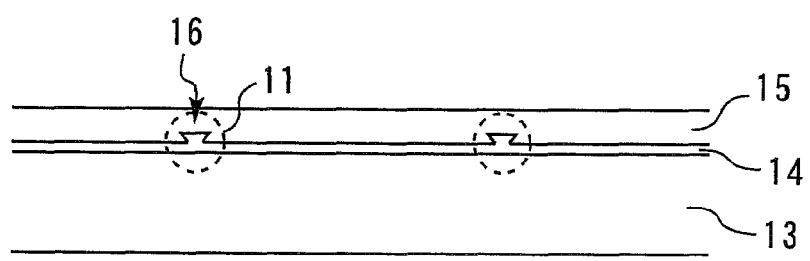

First, as shown in FIG. 1, laminated structure having light-emitting units 11 are formed on a single-crystal wafer 12 (wafer). Here, as the laminated structure, an AlGaAs layer 14 having an active layer is formed on a GaAs substrate 13, and a GaAs layer 15 is formed thereon, as shown in FIG. 2. The portions of ridges 16 formed on the AlGaAs layer 14 become the light-emitting units 11 that radiate laser beams.

Figure 3:
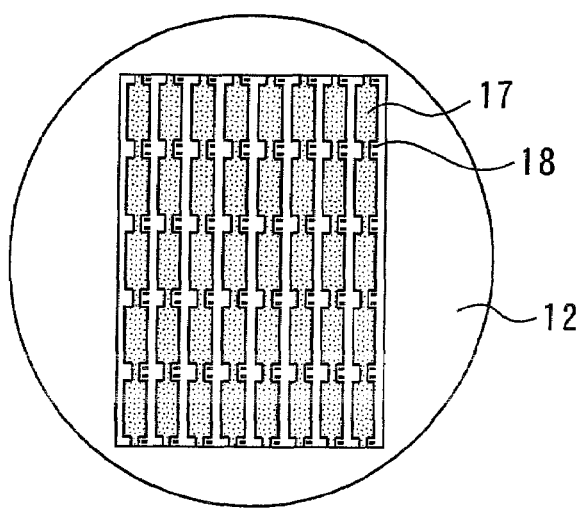
Figure 4:
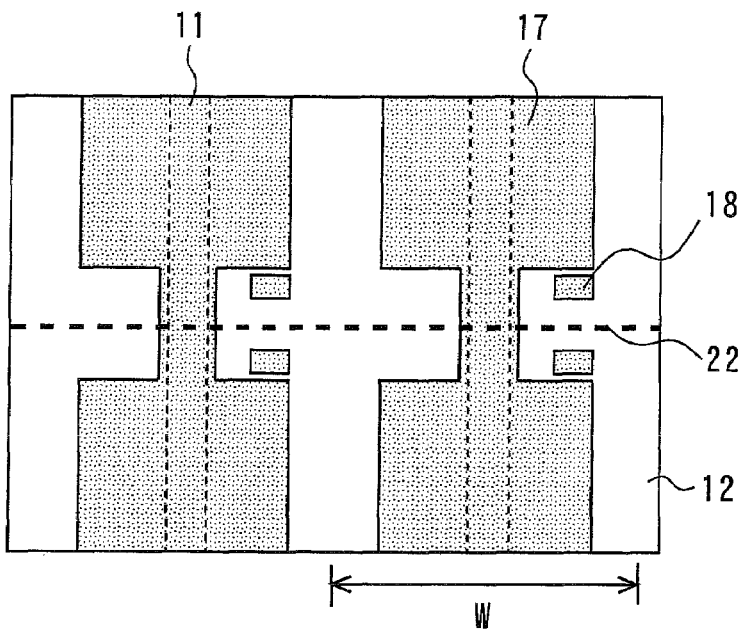
Figure 5:
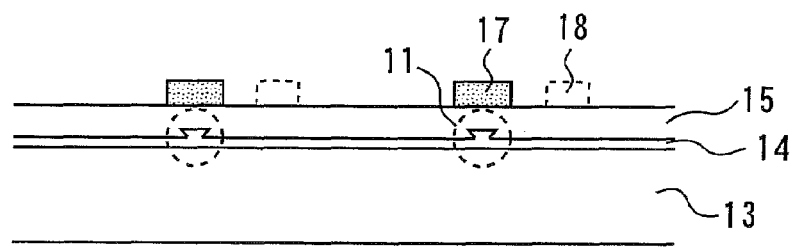

Next, as shown in FIG. 3, electrode patterns 17 and dummy patterns 18 are formed on the single-crystal wafer 12. Here, it is ideal to form the electrode patterns 17 for respective semiconductor light-emitting devices formed on the single-crystal wafer 12 so as to be parallel to the cleavage orientation of the single-crystal wafer 12. FIG. 4 is an enlarged plan view of a part of FIG. 3, and FIG. 5 is a sectional view along a desired cleavage line 22 in FIG. 4. As shown in these drawings, the electrode patterns 17 are formed on the single-crystal wafer 12 above the light-emitting units 11. The dummy patterns 1-8 (first dummy patterns) are formed on the single-crystal wafer 12 at locations, for example, at least W/4 apart from above the light-emitting units 11, and locations where the cleavage 19 out of the desired cleavage line 22 that intersects the light-emitting units 11 contacts. Here, W is the width of a chip. Although the vertical and horizontal widths of the dummy pattern 18 are not specified, the horizontal width is preferably short.

Figure 6:
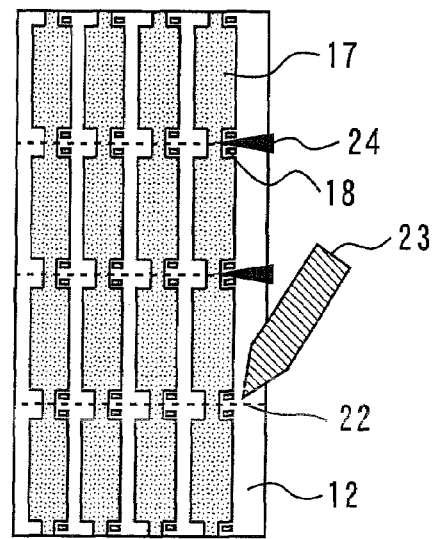
Figure 7:
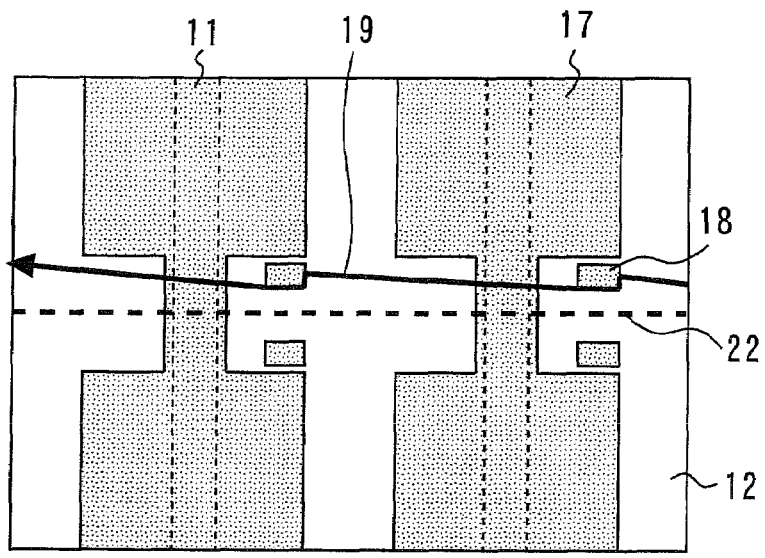

Next, as shown in FIG. 6, scratches 24 are formed using a diamond needle on desired cleavage lines 22 on one side of the single-crystal wafer 12. Then, the single-crystal wafer 12 is cleaved originating on the scratches 24 along the cleavage orientation in the direction from the dummy pattern 18 toward the light-emitting units 11. As described above, although the electrode patterns are ideally formed so as to be arranged in parallel to the cleavage orientation of the single-crystal wafer 12, they may be not parallel due to the accuracy of the exposing device and the like. In this case, as shown in FIG. 7, the cleavage 19 develops apart from the desired cleavage line 22 but along the cleavage orientation of the single-crystal wafer 12 (direction tilted from the electrode patterns 17), and contacts the dummy pattern 18 at a certain point. Thereafter, the cleavage 19 is developed while being corrected along the dummy pattern 18, and after the gap of the dummy pattern 18 where the cleavage 19 contacts, the cleavage 19 is developed again along the cleavage orientation of the single-crystal wafer 12 (direction tilted from the electrode patterns 17).

Figure 8:
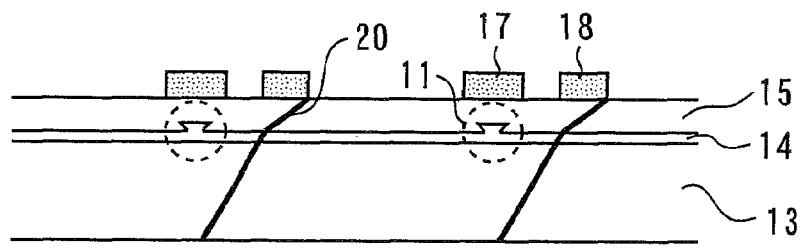

FIG. 8 is a side view showing the cleaved end surface of a semiconductor light-emitting device according to the first embodiment of the present invention. Since the cleavage 19 shown in FIG. 7 is shifted in the location where the cleavage 19 contacts the dummy pattern 18 and is adjusted, difference in level 20 is formed. Since the dummy pattern 18 is formed apart from the light-emitting units 11, the difference in level 20 is remote from the light-emitting units 11. Since no patterns are present in the last stage of the dummy pattern 18, the cleavage 19 is developed toward the cleavage orientation of the single-crystal wafer 12. Thereby, the formation of difference in level 20 in the last stage of the dummy pattern 18 can be prevented. Therefore, overlapping of difference in level 20 on the light-emitting unit 11 in the end surface can be prevented, thereby ensuring light-emitting properties and reliability.

Figure 9:
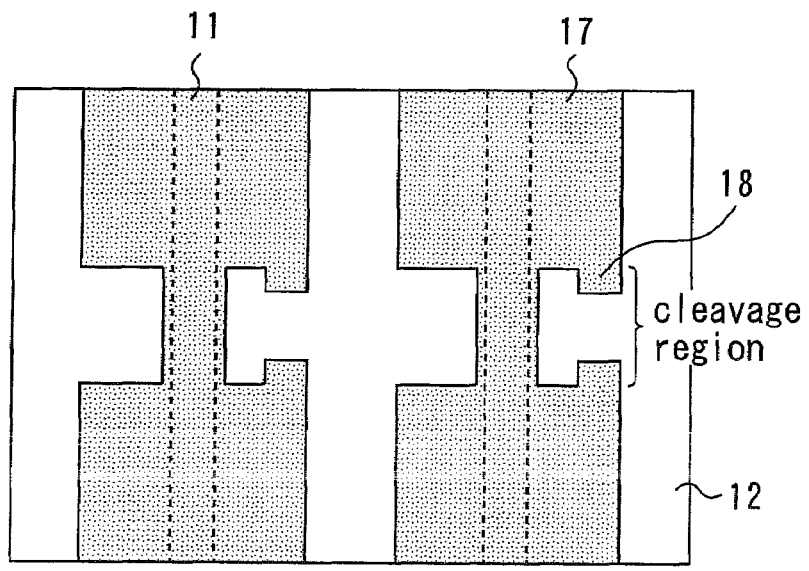

In the first embodiment, the case of an island-shaped pattern wherein the dummy patterns 18 are separated from the electrode patterns 17 is described. However, the present invention is not limited thereto, but the dummy patterns 18 may be a protruding pattern connected to the electrode patterns 17 in regions other than the cleavage region as shown in FIG. 9. Such a protruding pattern can be more easily processed than the island-shaped pattern.

Second Embodiment

Figure 10:
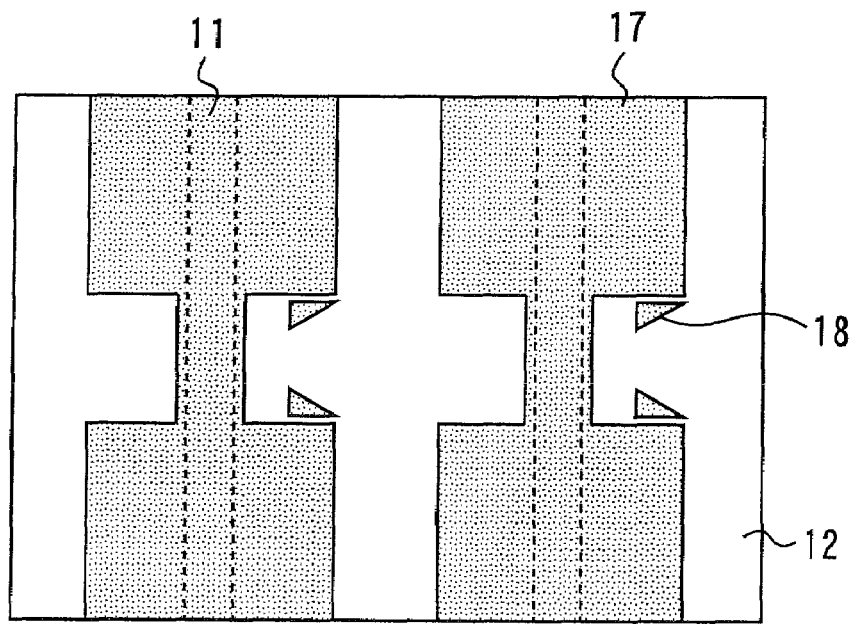
FIGS. 10-12 are views for explaining a method of manufacturing a semiconductor light-emitting device according to Second Embodiment of the present invention.

In the second embodiment, as shown in FIG. 10, the plane of the side of the dummy pattern 18 (first dummy pattern) where the cleavage is approaching is made to be a tapered plane inclined, for example, 45° to the cleavage direction. Other components are identical to the components of the first embodiment.

Figure 11:
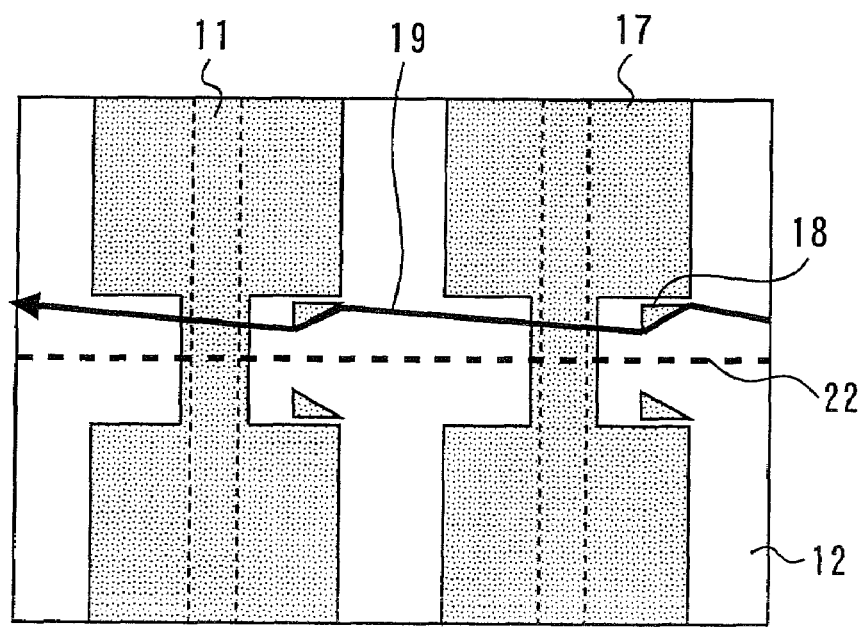

Thereby, as shown in FIG. 11, even when the offset of the cleavage orientation of the electrode patterns 17 and the single-crystal wafer 12 is large, and the cleavage 19 proceeds into the dummy pattern 18 at a sharp angle, the cleavage 19 can be surely captured by the taper of the dummy pattern 18. Therefore, the cleavage 19 can be shifted along the dummy pattern 18 to prevent overlapping of difference in level 20 on the light-emitting unit 11 in the end surface.

Figure 12:
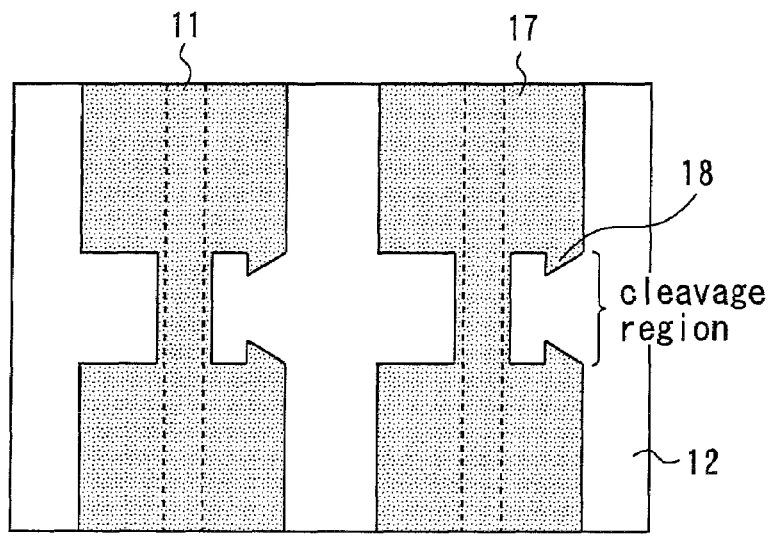

In the second embodiment, the case of an island-shaped pattern wherein the dummy patterns 18 are separated from the electrode patterns 17 is described. However, the present invention is not limited thereto, but the dummy patterns 18 may be a protruding pattern connected to the electrode patterns 17 in regions other than the cleavage region as shown in FIG. 12. Such a protruding pattern can be more easily processed than the island-shaped pattern.

Third Embodiment

Figure 13:
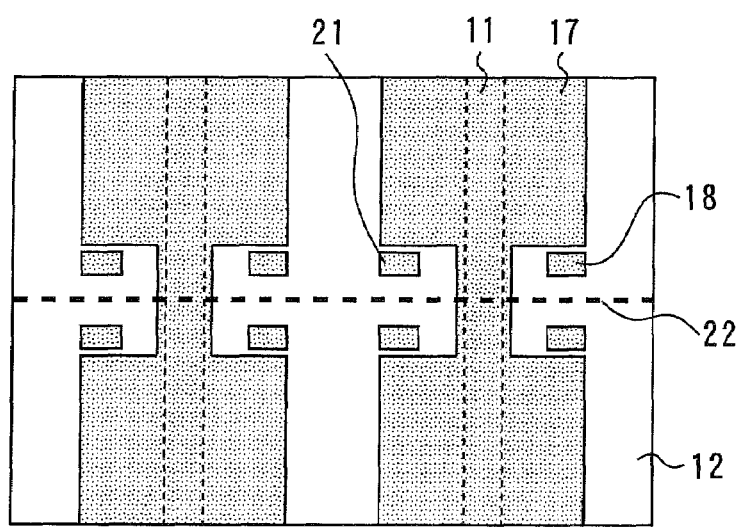
FIGS. 13-17 are views for explaining a method of manufacturing a semiconductor light-emitting device according to Third Embodiment of the present invention.
Figure 14:
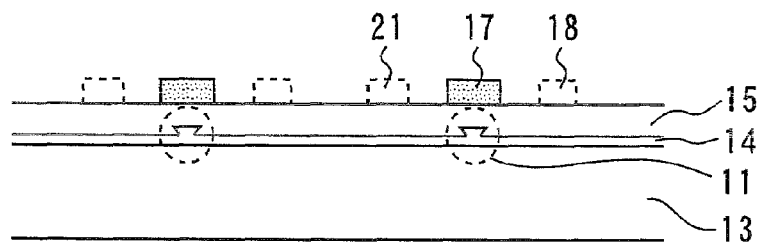

In the third embodiment, as shown in FIG. 13, dummy patterns 21 (second dummy patterns) are formed on the single-crystal wafer 12 at locations apart from above the light-emitting units 11, where cleavage 19 offset from the desired cleavage line 22 intersecting the light-emitting units 11 contacts, and on the opposite side to dummy patterns 18 (first dummy patterns) sandwiching the light-emitting units 11. FIG. 14 is a sectional view along the desired cleavage line 22 shown in FIG. 13.

Figure 15:
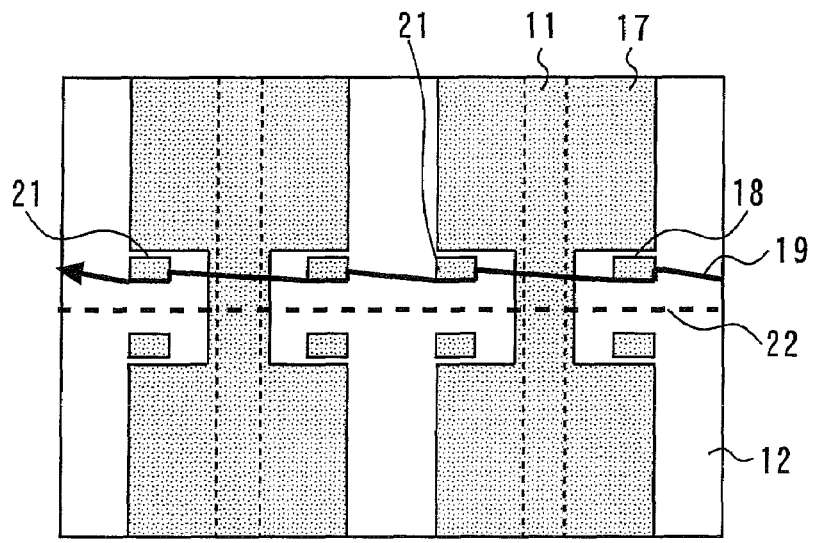

Next, the single-crystal wafer 12 is cleaved in the same manner as in the first embodiment. Here, as described above, although the electrode patterns are ideally formed so as to be arranged in parallel to the cleavage orientation of the single-crystal wafer 12, they may be not parallel due to the accuracy of the exposing device and the like. In this case, as shown in FIG. 15, the cleavage 19 develops apart from the desired cleavage line 22 but along the cleavage orientation of the single-crystal wafer 12 (direction tilted from the electrode patterns 17), and contacts the dummy patterns 18 and 21 at a certain point. Thereafter, the cleavage 19 is developed while being corrected along the dummy patterns 18 and 21, and after the gaps of the dummy patterns 18 and 21 where the cleavage 19 contacts, the cleavage 19 is developed again along the cleavage orientation of the single-crystal wafer 12 (direction tilted from the electrode patterns 17). Other components are identical to the components of the first or second embodiment.

Figure 16:
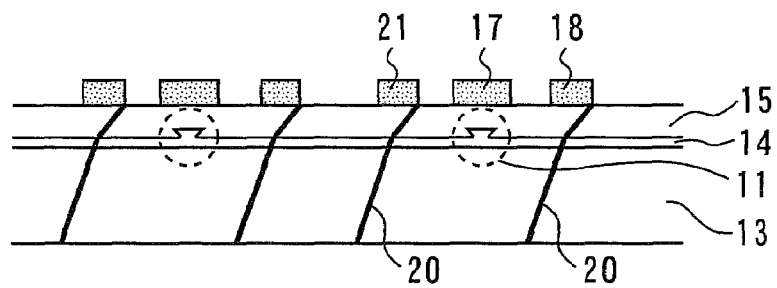

FIG. 16 is a side view showing the cleaved side surface of a semiconductor light-emitting device according to the third embodiment of the present invention. Since the cleavage 19 shown in FIG. 15 is shifted in the location where the cleavage 19 contacts the dummy patterns 18 and 21 and is adjusted, difference in level 20 is formed. Since the cleavage 19 is shifted twice by the dummy patterns 18 and 21 formed in the first and last stages of the light-emitting units 11 to reduce the shift quantity of respective dummy patterns 18 and 21, the difference in level 20 formed in the end surface is shallower than in the first or second embodiment, and becomes less apparent.

Figure 17:
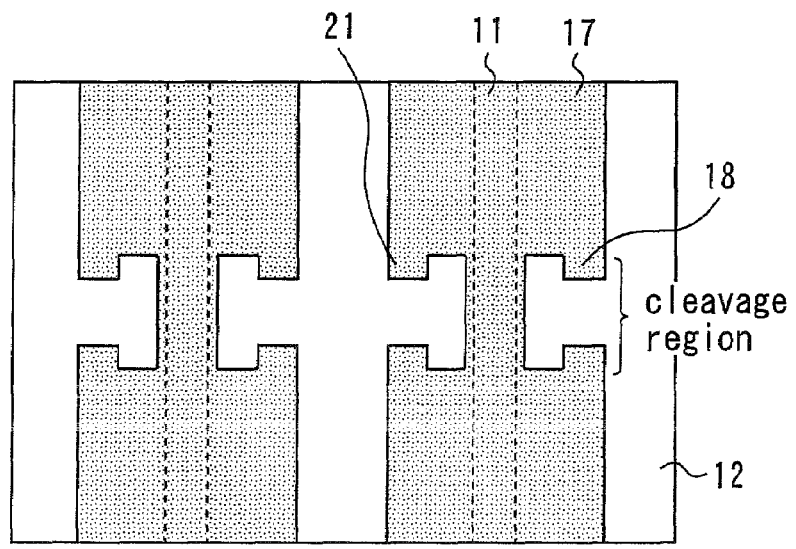

In the third embodiment, the case of an island-shaped pattern wherein the dummy patterns 18 and 21 are separated from the electrode patterns 17 is described. However, the present invention is not limited thereto, but the dummy patterns 18 and 21 may be protruding patterns connected to the electrode patterns 17 in regions other than the cleavage region as shown in FIG. 17. Such protruding patterns can be more easily processed than the island-shaped pattern.

Fourth Embodiment

Figure 18:
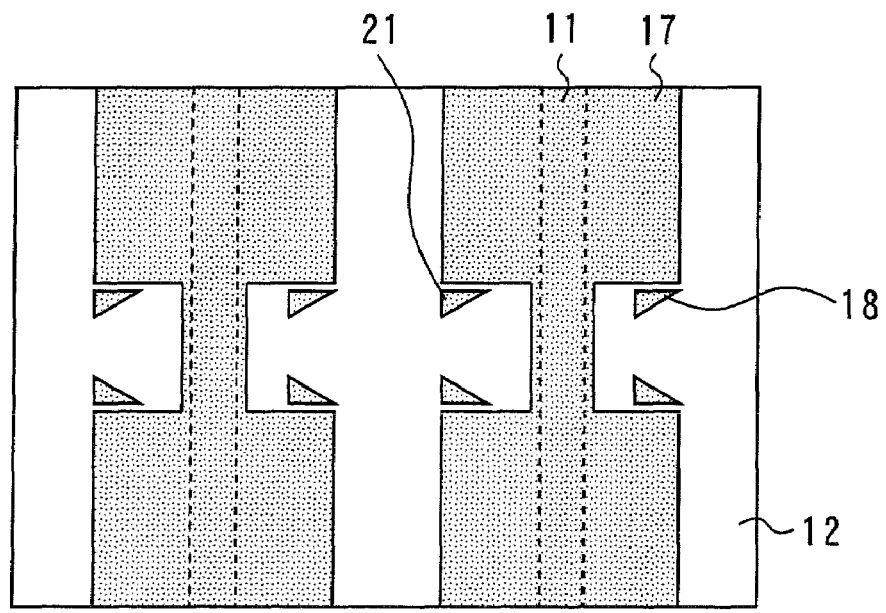
FIGS. 18-20 are views for explaining a method of manufacturing a semiconductor light-emitting device according to Fourth Embodiment of the present invention.

In the fourth embodiment, as shown in FIG. 18, the planes of the sides of the dummy patterns 18 and 21 (first and second dummy patterns) where the cleavage is approaching are made to be a tapered plane inclined, for example, 45° to the cleavage direction. Other components are identical to the components of the third embodiment.

Figure 19:
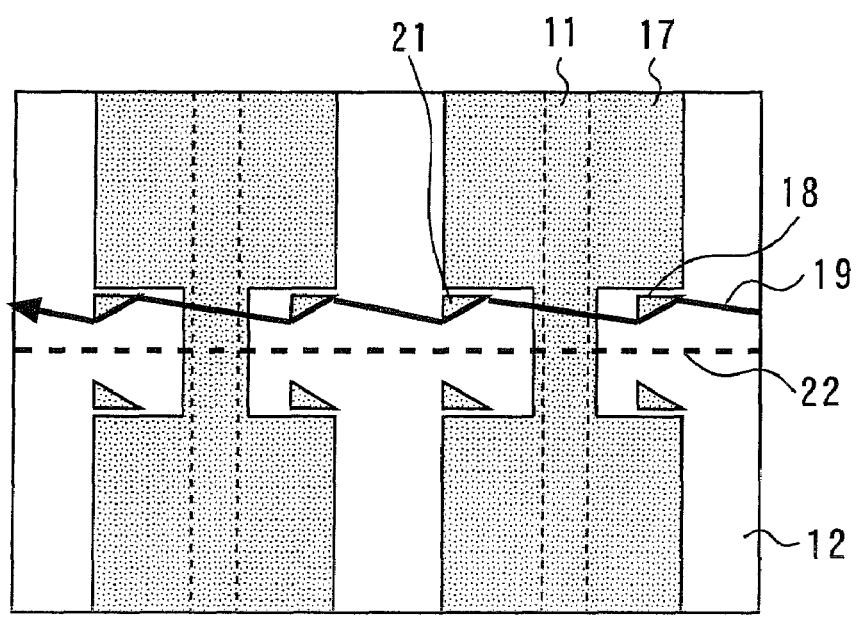

Thereby, the same effect as in the third embodiment can be obtained. As shown in FIG. 19, even when the offset of the cleavage orientation of the electrode patterns 17 and the single-crystal wafer 12 is large, and the cleavage 19 proceeds into the dummy patterns 18 and 21 at a sharp angle, the cleavage 19 can be surely captured by the tapers of the dummy patterns 18 and 21. Therefore, the cleavage 19 can be shifted along the dummy patterns 18 and 21 to prevent overlapping of difference in level 20 on the light-emitting units 11 in the end surface.

Figure 20:
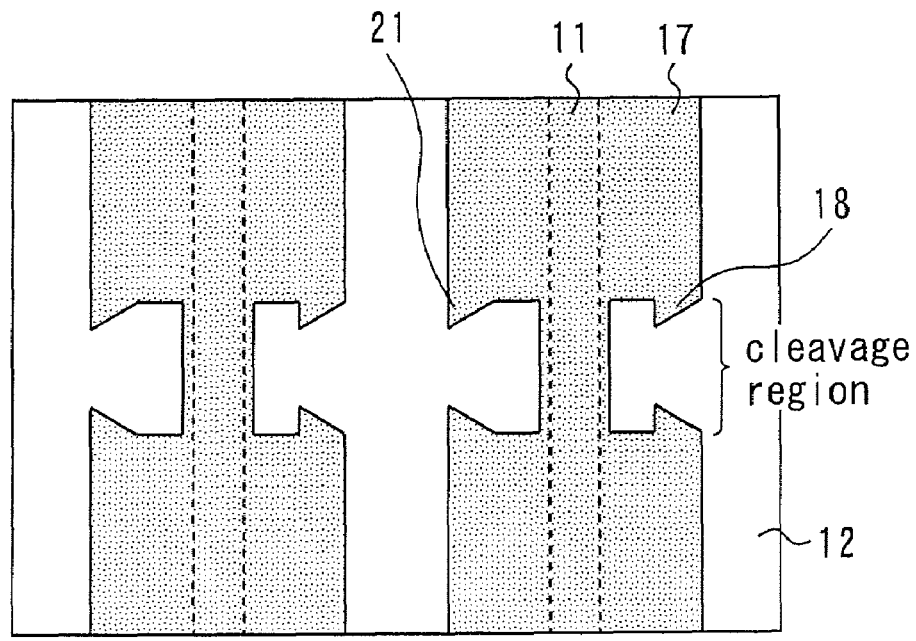
Figure 21:
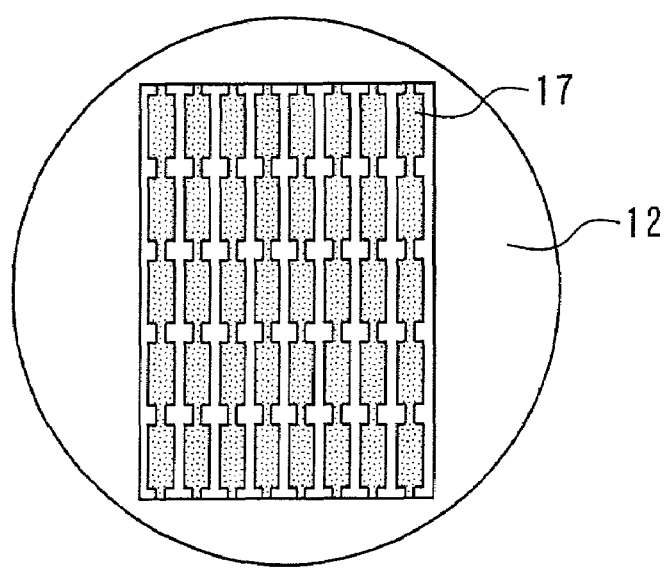
FIGS. 21-24 are views for explaining a conventional method of manufacturing a semiconductor light-emitting device.
Figure 22:
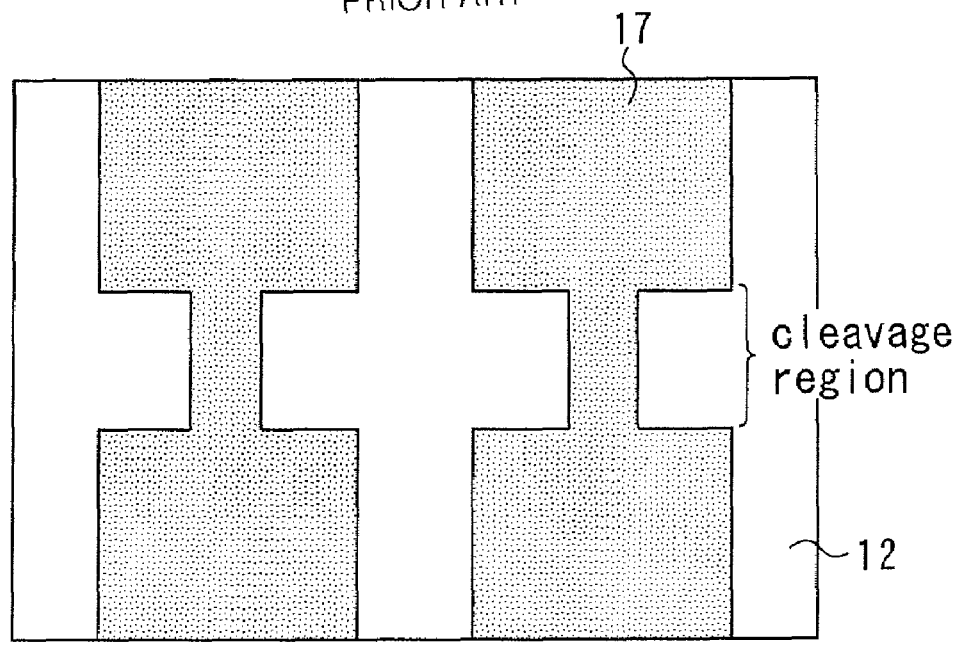
Figure 23:
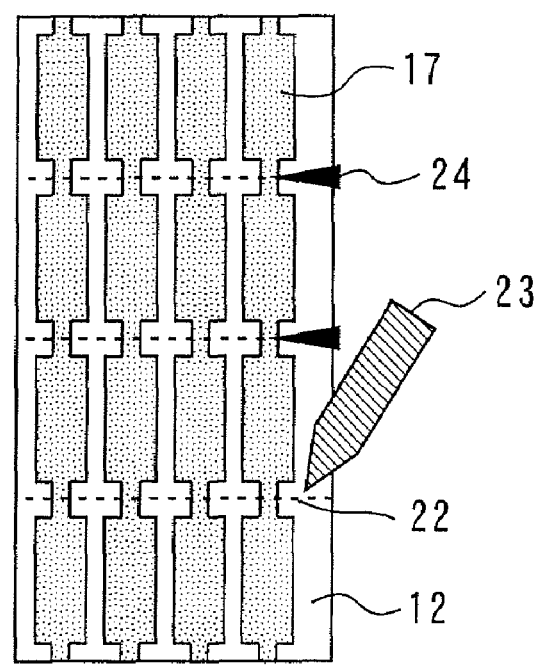
Figure 24:
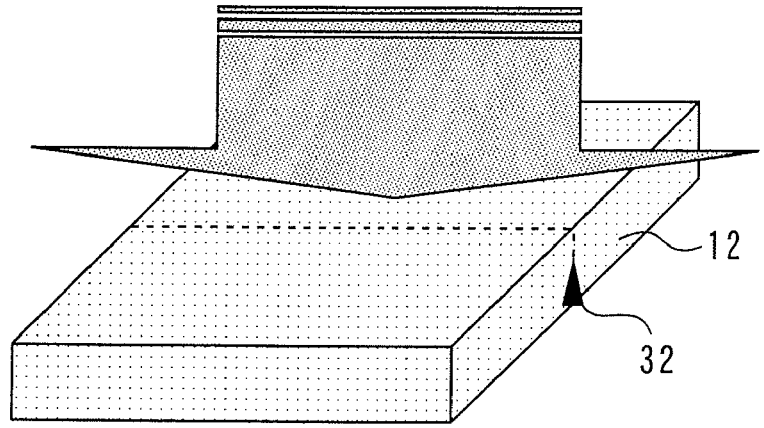
Figure 25:
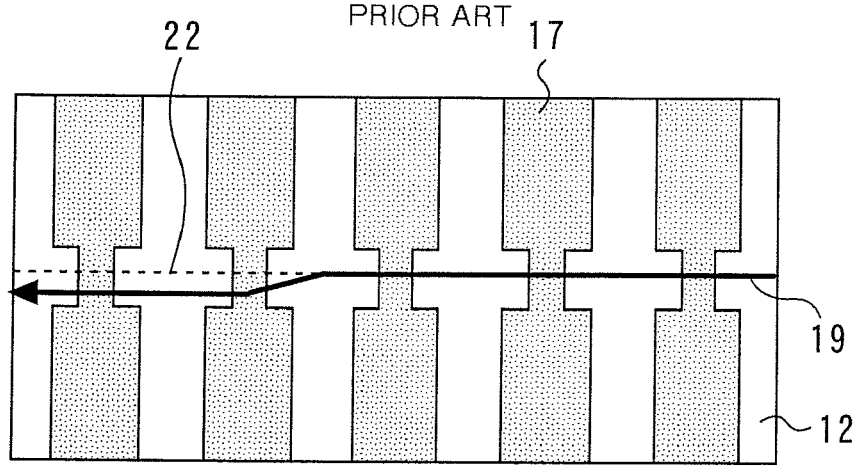
FIGS. 25-26 are views for explaining a problem of the conventional method of manufacturing a semiconductor light-emitting device.
Figure 26:
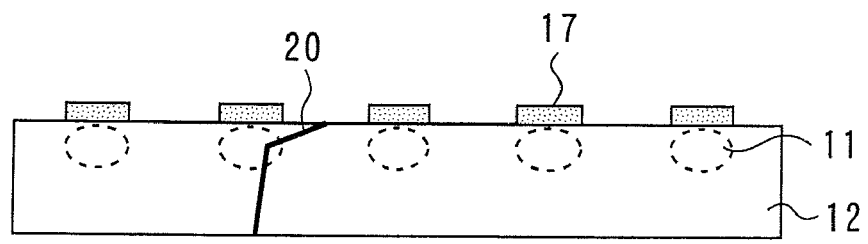
Figure 27:
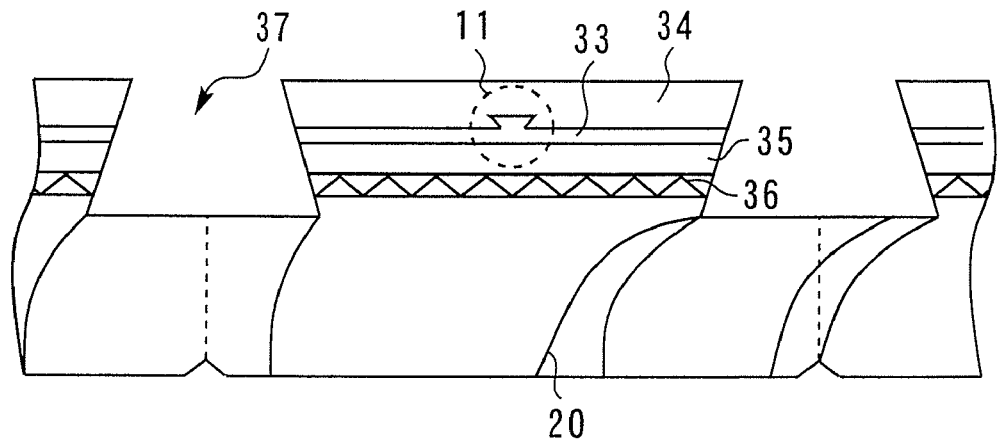
FIG. 27 is a view for explaining an improved conventional method of manufacturing a semiconductor light-emitting device.
Figure 28:
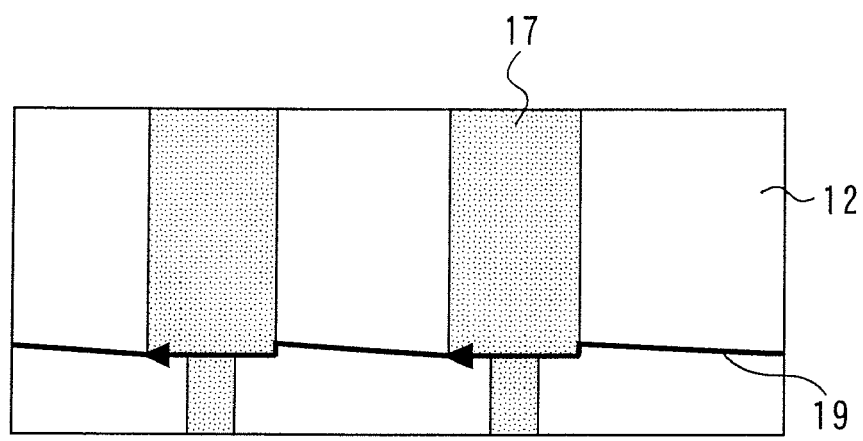
FIGS. 28-29 are views for explaining a problem of the improved conventional method of manufacturing a semiconductor light-emitting device.
Figure 29:
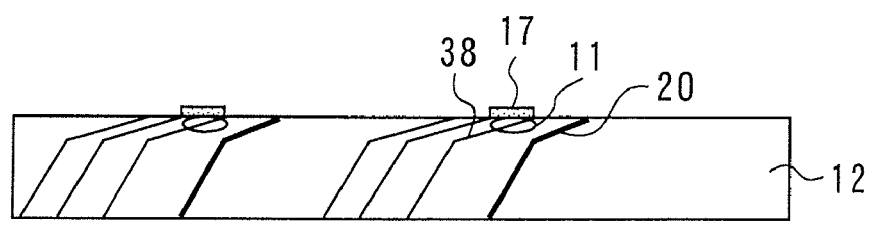

In the fourth embodiment, the case of an island-shaped pattern wherein the dummy patterns 18 and 21 are separated from the electrode patterns 17 is described. However, the present invention is not limited thereto, but the dummy patterns 18 and 21 may be protruding patterns connected to the electrode patterns 17 in regions other than the cleavage region as shown in FIG. 20. Such protruding patterns can be more easily processed than the island-shaped pattern.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-283990, filed on Oct. 31, 2007 including specification, claims, drawings and summary, on which the Convention priority of the present application is based, are incorporated herein by reference in its entirety.

What is claimed is:

1. A method for manufacturing a semiconductor light-emitting device comprising:

forming a laminated structure including a plurality of light-emitting units on a single crystal semiconductor wafer;

forming respective electrode patterns on said wafer at locations opposite said light-emitting units;

forming first dummy patterns on said wafer at respective locations spaced apart from the locations opposite said light-emitting units, and offset from a desired cleavage line that intersects said light-emitting units;

forming a scratch on said wafer on the desired cleavage line; and cleaving said wafer, originating on said scratch, along a cleavage orientation in a cleavage direction, from said first dummy patterns toward said light-emitting units.

2. The method for manufacturing a semiconductor light-emitting device according to claim 1, wherein one side of each of said first dummy patterns proximate the desired cleavage line is oblique to the cleavage direction.

3. The method for manufacturing a semiconductor light-emitting device according to claim 1, including forming second dummy patterns on said wafer at locations spaced apart from the locations opposite said light-emitting units, offset from the desired cleavage line, and on opposite sides of respective light-emitting units from corresponding first dummy patterns, pairs of said first and second dummy patterns sandwiching respective light-emitting units.

4. The method for manufacturing a semiconductor light-emitting device according to claim 3, wherein one side of each of said second dummy patterns proximate the desired cleavage line is oblique to the cleavage direction.

* * * * *